United States Patent [19]
Masaie et al.

[11] Patent Number: 5,223,762
[45] Date of Patent: Jun. 29, 1993

[54] SURFACE ACOUSTIC WAVE FILTER

[75] Inventors: Kimio Masaie; Haruo Morii, both of Nagaokakyo, Japan

[73] Assignee: Murata Manufacturing Co., Ltd., Japan

[21] Appl. No.: 816,291

[22] Filed: Dec. 27, 1991

[30] Foreign Application Priority Data

Dec. 27, 1990 [JP] Japan ................................ 2-416291
Dec. 27, 1990 [JP] Japan ................................ 2-416292
Dec. 27, 1990 [JP] Japan ................................ 2-416293

[51] Int. Cl.$^5$ ............................................ H01L 41/08
[52] U.S. Cl. .............................. 310/313 D; 310/313 B; 333/195
[58] Field of Search ................... 310/313 D, 313 B; 333/154, 195

[56] References Cited

U.S. PATENT DOCUMENTS

| | | | |
|---|---|---|---|
| 3,894,251 | 7/1975 | Shibayama et al. | 310/313 R |
| 3,909,753 | 9/1975 | Burrow | 310/313 R |
| 4,314,215 | 2/1982 | Tanji et al. | 333/193 |
| 4,468,642 | 8/1984 | Hikita et al. | 333/195 |
| 4,734,664 | 3/1988 | Hikita et al. | 333/154 |
| 4,803,449 | 2/1989 | Hikita et al. | 310/313 R |
| 4,931,775 | 6/1990 | Sakamoto et al. | 333/193 |

FOREIGN PATENT DOCUMENTS 0160123 12/1981 Japan ................................ 333/195
0157112 7/1986 Japan ................................ 333/195

Primary Examiner—Mark O. Budd
Assistant Examiner—Thomas M. Dougherty
Attorney, Agent, or Firm—Ostrolenk, Faber, Gerb & Soffen

[57] ABSTRACT

Two surface acoustic wave resonators are transversely formed with a minute spacing between them on a piezoelectric substrate. Said two surface acoustic wave resonators are oppositely formed to each other to become line-symmetry. Each of the surface acoustic wave resonator comprises an interdigital transducer and reflectors formed on its both sides. An input terminal and an output terminal are lead from the corresponding interdigital transducer. Between the input and the output terminals, an electrostatic capacity is bridged. The electrostatic capacity is formed on, for example, a piezoelectric substrate. In this case, the electrostatic capacity may be formed by alternately interdigitating each part of comb-like electrodes of the two interdigital transducers. Furthermore, the electrostatic capacity may be formed by alternately interdigitating both parts of the two reflector electrodes.

8 Claims, 10 Drawing Sheets

F I G. 4
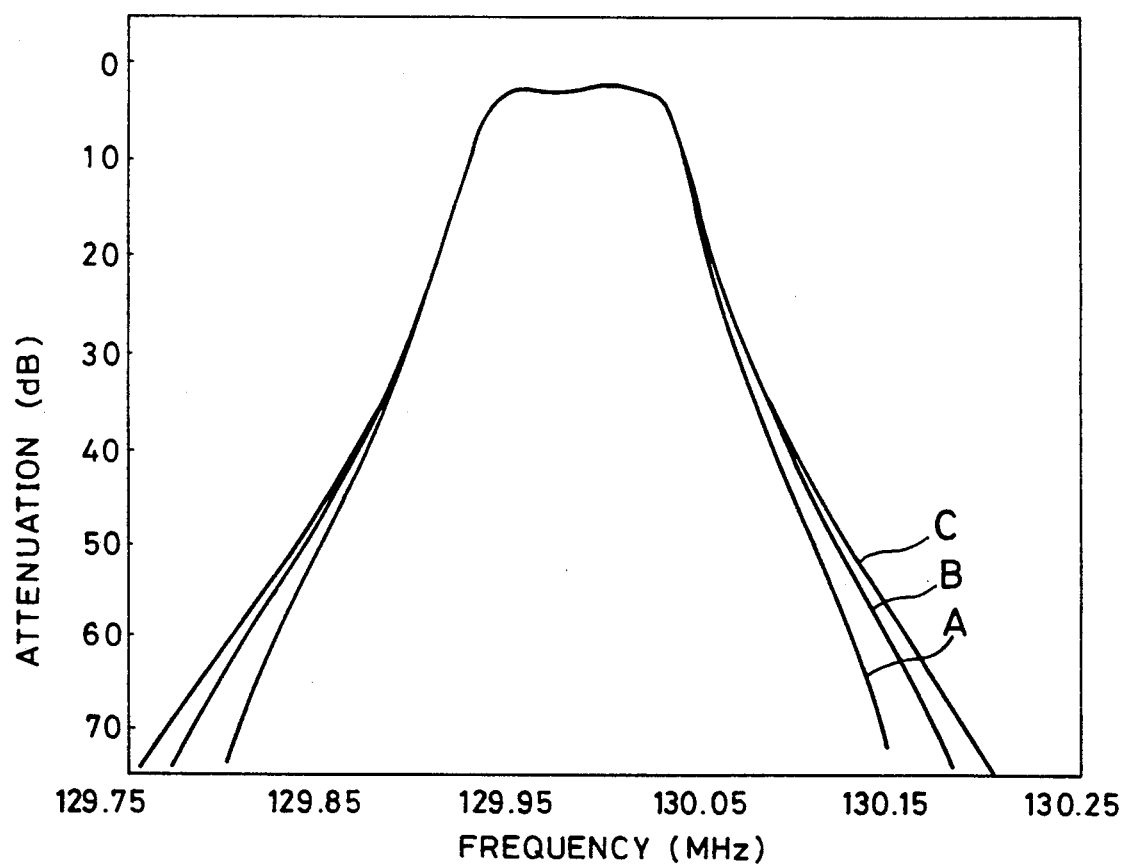

F I G. 9
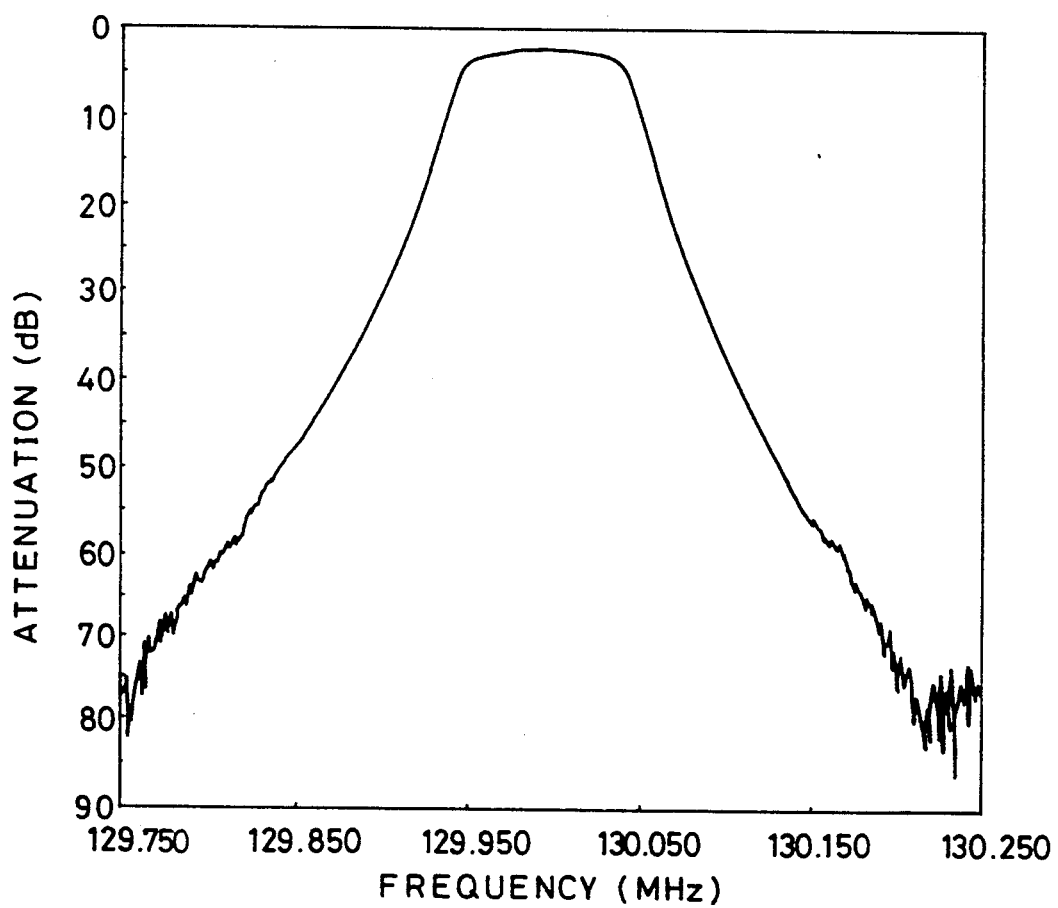

SURFACE ACOUSTIC WAVE FILTER

BACKGROUND OF THE INVENTION

1. Field of the Invention

This invention relates to a surface acoustic wave filter and, more particularly, to the same that is formal with two surface acoustic wave resonators which comprise interdigital transducers and reflectors on a piezoelectric substrate and are transversely disposed with a minute spacing between them.

2. Description of the Prior Art

FIG. 12 is an illustration diagram showing one example of the conventional surface acoustic wave filters which are in the background of the present invention. The surface acoustic wave filter 1 comprises a piezoelectric substrate 2. On the piezo-electric substrate 2, two surface acoustic wave resonators 3 are formed. The surface acoustic wave resonator 3 includes an interdigital transducer 4 and two reflectors 5 formed on both sides of the interdigital transducer 4. These two surface acoustic wave resonators 3 are so formed that they are opposite to each other to become line-symmetry. From the two interdigital transducers 4, an input terminal 6 and an output terminal 7 are correspondingly extended, and an earth terminal 8 is also extended which connects the interdigital transducers 4 and reflectors 5.

Circuits equivalent to the surface acoustic wave filter 1 of FIG. 12 are shown in FIGS. 13 and 14. In the equivalent circuits of FIGS. 13 and 14, $L_1 = L_s = L_a$, $R_1 = R_s = R_a$, and $1/C_m = 1/C_a - 1/C_s$ are predetermined. This surface acoustic wave filter 1 is formed as, for example, a bandpass type filter.

When such a surface acoustic wave filter is used, especially, in mobile communication equipment, steeper selectivity, that is, a good shape factor is required in many cases. In such a case, a method is generally used in which a plurality of the surface acoustic wave filters are cascade-connected to steepen the selectivity.

However, when a plurality of the surface acoustic wave filters are cascade-connected, the selectivity becomes steep and simultaneously an insertion loss falls large, and furthermore a passband width becomes narrower than it is required.

SUMMARY OF THE INVENTION

Therefore, it is an object of the present invention to provide a surface acoustic wave filter which does not increase the insertion loss, and does not narrow the passband width, and can steepen the selectivity.

A surface acoustic wave filter of the invention is the surface acoustic wave filter including a piezoelectric substrate and two surface acoustic wave resonators which are comprised of interdigital transducers and reflectors on the piezoelectric substrate and are oppositely disposed to each other to become line-symmetry, wherein an electrostatic capacity is bridged between an input terminal and an output terminal of the filter.

The electrostatic capacity is formed, for example, on a piezoelectric substrate. In this case, the capacity may be formed by interdigitating both parts of comb-like electrodes of the two interdigital transducers of the two surface acoustic wave resonators. Besides, the capacity may be formed by interdigitating both parts of electrodes of the two reflectors of the two surface acoustic wave resonators.

The bridge-connection of the electrostatic capacity between the input and the output terminals allows the frequency characteristic of the surface acoustic wave filter to become steep.

Furthermore, when the electrostatic capacity is formed by utilizing the comb-like electrodes of the interdigital transducers or the electrodes of the reflectors, it is unnecessary to connect an electrostatic capacity using wire bonding or drawing around electrodes. Thereby, it is also unnecessary to enlarge the piezoelectric substrate, and the affection of inductance produced by the wire bonding or drawing around electrodes can be avoided.

Furthermore, when the electrostatic capacity is formed by utilizing the electrodes of the reflectors, generation of an unwanted mode spurious wave can be suppressed.

According to the present invention, an excellent surface acoustic wave filter can be obtained which does not increase an insertion loss, and does not narrow a passband width, and can have steep selectivity.

The above and further objects, features, aspects and advantages of the present invention will be more fully apparent from the following detailed description of the embodiments with accompanying drawings.

BRIEF DESCRIPTION OF THE DRAWINGS

FIG. 4 is a graph showing frequency characteristic of surface acoustic wave filters of the invention and the conventional surface acoustic wave filter.

FIG. 9 is a graph showing a frequency characteristic of the conventional surface acoustic wave filter.

DESCRIPTION OF THE PREFERRED EMBODIMENTS

Figure 1:
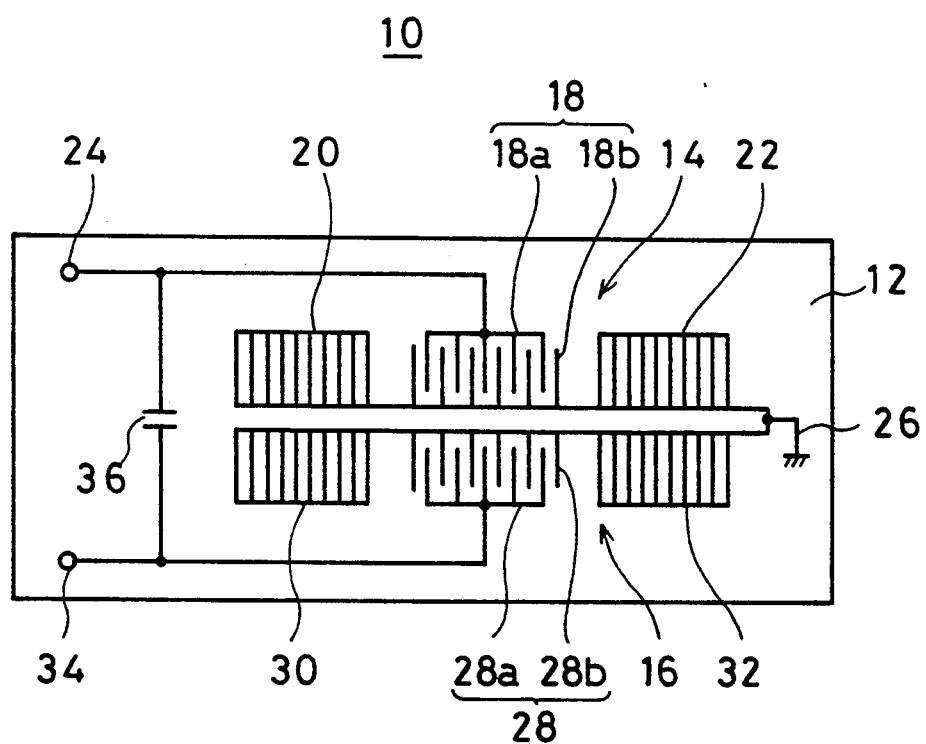
FIG. 1 is an illustration diagram showing one embodiment of the present invention.

FIG. 1 is an illustration diagram showing one embodiment of the present invention. A surface acoustic wave filter 10 includes a piezoelectric substrate 12. As a material of the piezoelectric substrate 12, for example, an ST-cut crystal is used. On the piezoelectric substrate 12, two surface acoustic wave resonators 14 and 16 are formed. One surface acoustic wave resonator 14 includes an interdigital transducer 18, and on both sides of the interdigital transducer 18, two reflectors 20 and 22 are formed.

The interdigital transducer 18 is formed in a longitudinal center of the piezoelectric substrate 12. The interdigital transducer 18 is formed by interdigitating two comb-like electrodes 18a and 18b. The interdigital transducer 18 of this embodiment includes 130 pairs of these comb-like electrodes 18a and 18b. Designating a wavelength of a surface acoustic wave induced by the surface acoustic wave filter 10 as λ, an interdigitating width of the interdigital transducer 18 is set to 9 λ. One comb-like electrode 18a of the interdigital transducer 18 is connected to an input terminal 24 and the other comb-like electrode 18b is connected to an earth terminal 26.

The reflectors 20 and 22 are formed on both longitudinal sides of the piezoelectric substrate 12, taking the interdigital transducer 18 as a center. The reflectors 20 and 22 have a plurality of electrodes extending in a transverse direction of the piezoelectric substrate 12, and these electrodes are connected to an earth terminal 26. In this embodiment, a number of the electrodes of the reflectors 20 and 22 are respectively 135 pieces. Opening lengths of the reflectors 20 and 22 are respectively set to 9 λ, designating a wavelength of a surface acoustic wave as λ. The interdigital transducer 18 and the reflectors 20 and 22 are made of, for example, aluminum.

The other surface acoustic wave resonator 16, like the surface acoustic wave resonator 14, has an interdigital transducer 28, and on both sides of it reflectors 30 and 32 are formed. The interdigital transducer 28 includes two comb-like electrodes 28a and 28b. One comb-like electrode 28a is connected to an output terminal 34 and the other comb-like electrode 28b is connected to an earth terminal 26. The reflectors 30, 32 are respectively formed with, for example, 135 pieces of electrodes and connected to the earth terminal 26. This surface acoustic wave resonator 16 is oppositely formed to the other surface acoustic wave resonator 14 so that they are in line-symmetry. The gap width between the two surface acoustic wave resonators 14 and 16 is set to 0.9 λ, designating a wavelength of a surface acoustic wave as λ.

Between the input terminal 24 and the output terminal 34, an electrostatic capacity 36 is bridged. The capacity 36 is formed, for example, on a piezoelectric substrate 12. The waveform of a frequency characteristic of the surface acoustic wave filter 10 can be made steep by the electrostatic capacity 36.

Figure 2:
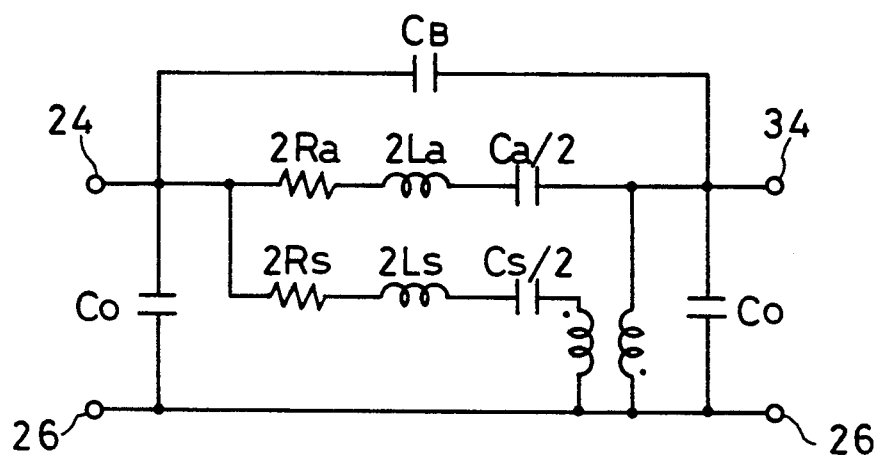
FIG. 2 is an equivalent circuit diagram of the surface acoustic wave filter of FIG. 1.
Figure 3:
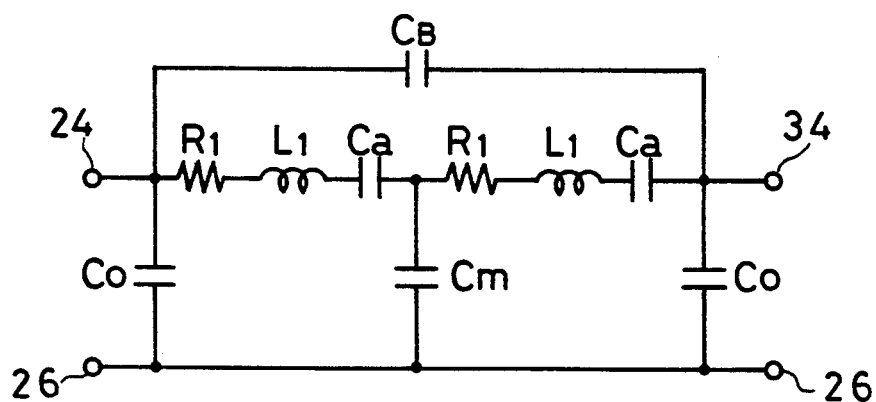
FIG. 3 is an equivalent circuit diagram equal to the equivalent circuit diagram of FIG. 2.

Equivalent circuits of this surface acoustic wave filter 10 are shown in FIGS. 2 and 3. In FIGS. 2 and 3, $L_1=L_s=L_a$, $R_1=R_s=R_a$ and $1/C_m=1/C_a-1/C_s$ are predetermined. Further, $C_B$ shows an electrostatic capacity 36 between the input terminal 24 and the output terminal 34.

Frequency characteristics Of the surface acoustic wave filter 10 of this invention and the conventional surface acoustic wave filter are shown in FIG. 4. These frequency characteristics are obtained when the surface acoustic wave filters are cascade-connected in two-stage. In FIG. 4, curve A shows a characteristic when 0.035 pF is used as the electrostatic capacity 36, and curve B shows a characteristic when 0.01 pF is used as the capacity 36 and curve C exhibits a characteristic of the conventional surface acoustic wave filter.

As can be seen from FIG. 4, the surface acoustic wave filter 10 of the present invention shows a steeper slope in rise of the passband as compared with the conventional filter having no electrostatic capacity between the input and output terminals. That is, it can be seen that the surface acoustic wave filter 10 of the invention has been improved in selectivity as compared with the conventional filters. Therefore, the selectivity of the surface acoustic wave filter can be improved even when using a smaller number of stages in multistage connection, and when having the same selectivity as that of the conventional filter, the filter of the present invention can have a smaller insertion loss.

Furthermore, the surface acoustic wave filter 10 of the invention has been improved in a shape factor as compared with that of the conventional one, and when having the same selectivity as that of the conventional one, the passband width of the filter of the invention is no narrowed beyond necessity.

The frequency characteristics of FIG. 4 show ones when two-stage of the filter are cascade-connected, but when only one stage of the filter is used or three or more stages of the surface acoustic wave filter are cascade-connected, the same effect can be obtained.

Furthermore, a number of electrode pairs of the interdigital transducers 18 and 28 and a number of electrode pieces of the reflectors 20, 22, 30 and 32 can be arbitrarily set if necessary.

Figure 5:
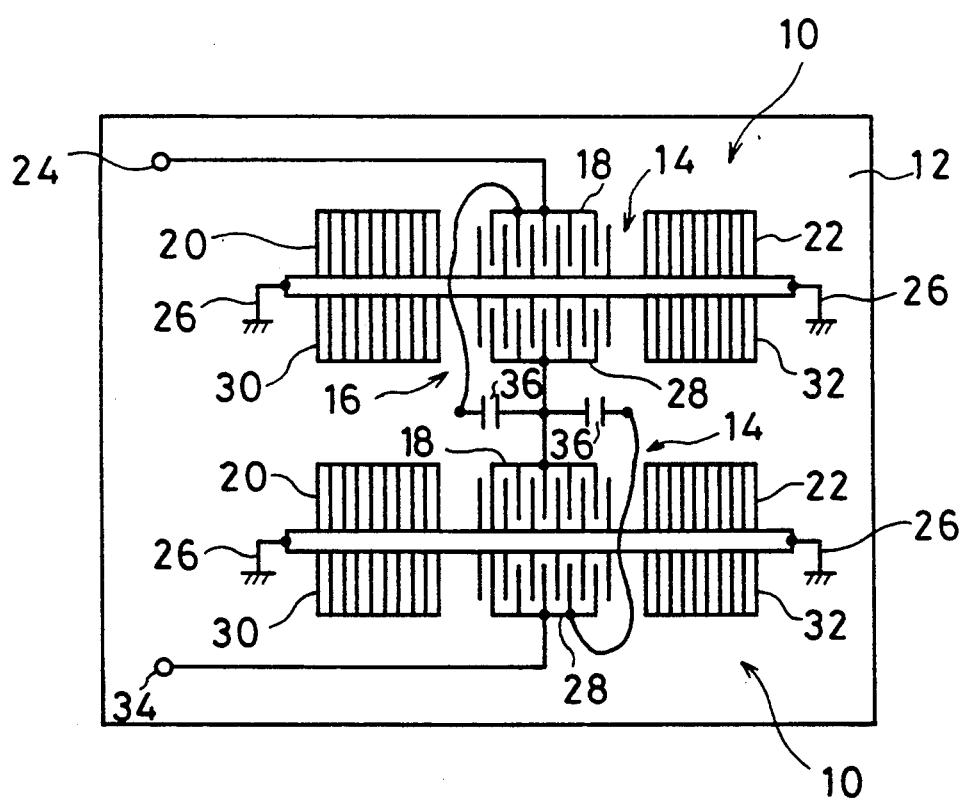
FIG. 5 is an illustration diagram showing two-stage cascade connection of the surface acoustic wave filter of FIG. 1 on the same substrate.

As shown in FIG. 5, when two surface acoustic wave filters 10 are formed on the same substrate and cascade-connected, a wire bonding method is employed in which a wire goes over the interdigital transducers 18 and 28. But a surface acoustic wave induced by one surface acoustic wave filter 10 sometimes affects on the other surface acoustic wave filter 10. In order to prevent it, a damping agent is usually coated on the substrate between the two surface acoustic wave filters.

However, the wire bonding is performed, avoiding portions coated with the damping agent, thus the area of a piezoelectric substrate 12 must be large and the surface acoustic wave filter 10 becomes large-sized. Thus the wire bonding method in which a wire goes over the interdigital transducers 18 and 28 is not preferable to filter manufacturing and its electrical characteristics. Therefore, it may be considered that the electrostatic capacities 36 are connected by drawing around electrodes, but in this case also the area of the piezoelectric substrate 12 becomes large and there arises an affection of inductance produced by drawing around electrodes.

Figure 6:
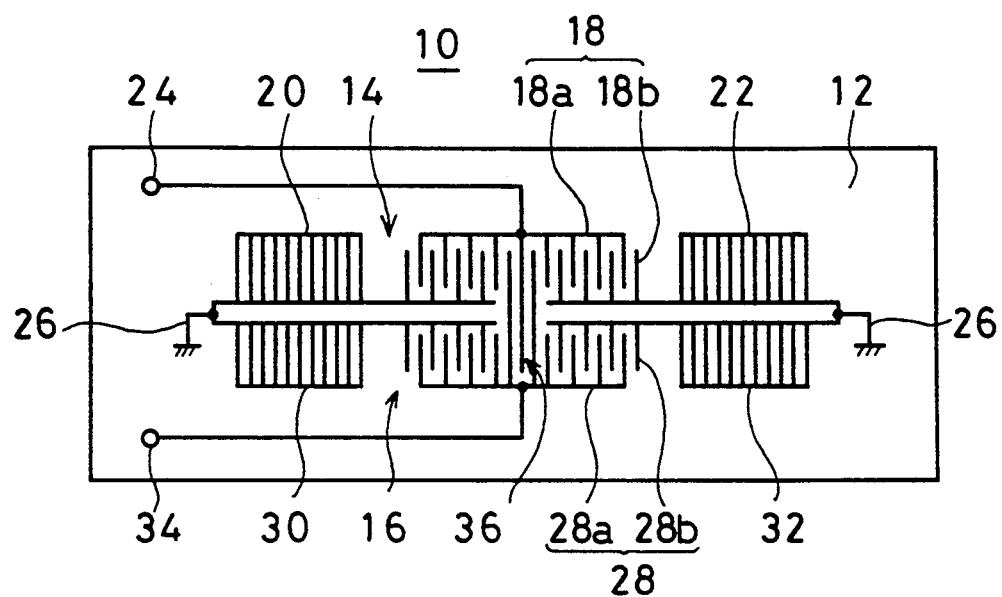
FIG. 6 is an illustration diagram showing another embodiment of the invention.

In order to solve such a problem, a surface acoustic wave filter as shown in FIG. 6 may be considered. In this surface acoustic wave filter 10, one interdigital transducer 18 and the other interdigital transducer 28 are so formed that their comb-like electrodes 18a and 28a interdigitate with each other in their center portions, thereby the electrostatic capacity 36 is formed between the comb-like electrodes 18a and 28a. This capacity 36 is bridged between the input terminal 24 and the output terminal 34. Concerning a pitch of the comb-like electrodes 18a and 28a of the portion of the electrostatic capacity 36, it is not necessary to equalize the pitch to that of the interdigital transducers 18 and 28. To form the electrostatic capacity 36 with a small area, it is preferable to reduce the pitch of the electrode 36.

Figure 7:
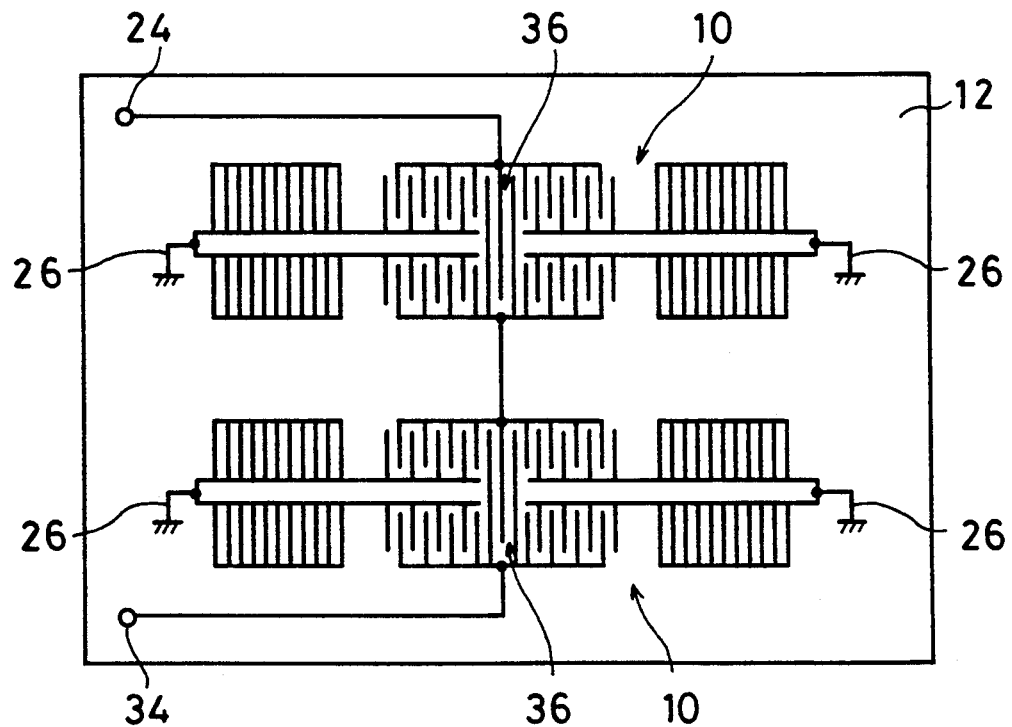
FIG. 7 is an illustration diagram showing two-stage cascade connection of the surface acoustic wave filter of FIG. 6 on the same substrate.
Figure 8:
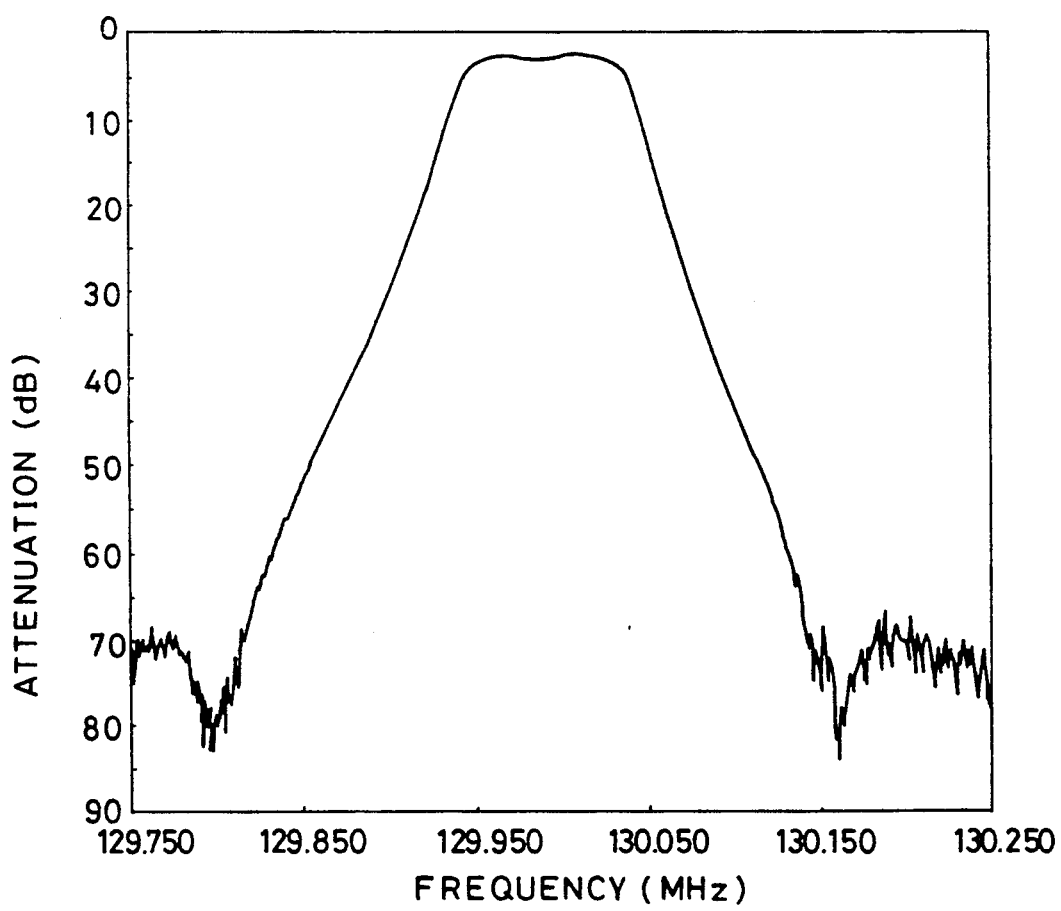
FIG. 8 is a graph showing a frequency characteristic of the surface acoustic wave filter of FIG. 7.

FIG. 7 is an illustration diagram showing two-stage cascade connection of the surface acoustic wave filter 10 of FIG. 6. The frequency characteristic of this cascade-connected surface acoustic wave filter 10 is shown in FIG. 8. In addition, the frequency characteristic of two-stage cascade connection of the conventional surface acoustic wave filters in which no electrostatic capacity is formed is shown in FIG. 9. As can be seen from FIGS. 8 and 9, this surface acoustic wave filter 10 has steeper selectivity as compared with that of the conventional filter. Furthermore, its passband width is almost the same as that of the conventional filter.

In this surface acoustic wave filter 10, the electrostatic capacity 36 is formed by utilizing the interdigital transducers 18 and 28 thus wire bonding and drawing around electrodes are unnecessary. Therefore, it is not necessary to enlarge the substrate 12, and its size can be equalized to that of the conventional surface acoustic wave filter, thus it is unnecessary to enlarge the surface acoustic wave filter 10. Still further, this surface acoustic wave filter 10 is not affected by inductance produced by wire bonding and drawing around electrodes.

Furthermore, in this surface acoustic wave filter 10, the electrostatic capacity 36 is formed by utilizing the comb-like electrode 28a of the interdigital transducer 28, thus the filter 10 can be manufactured by the same process as that of the conventional surface acoustic wave filter in which no electrostatic capacity is formed.

The frequency characteristic of FIG. 8 shows one when two stages of the surface acoustic wave filter 10 are cascade-connected, but the same effect can be obtained when only one stage of the filter is used or three or more stages are cascade-connected.

However, in the surface acoustic wave filter as shown in FIG. 6, part of the interdigital transducer is sacrificed, thus sometimes an unwanted mode spurious wave generates. To solve such a problem, a surface acoustic wave filter shown, for example, in FIG. 10 may be considered. In this surface acoustic wave filter 10, the reflector 22 of one surface acoustic wave resonator 14 and the reflector 32 of the other surface acoustic wave resonator 16 are so formed that their electrodes interdigitate to each other in their center portions, thereby the electrostatic capacity 36 is formed between the reflectors 22 and 32. This capacity is bridged between the input terminal 24 and the output terminal 34. Furthermore, when an electrode pitch of the portion of the electrostatic capacity 36 is equalized to that of the other reflector portions, the capacity 36 portion works as a reflector as well as an electrostatic capacity.

Figure 10:
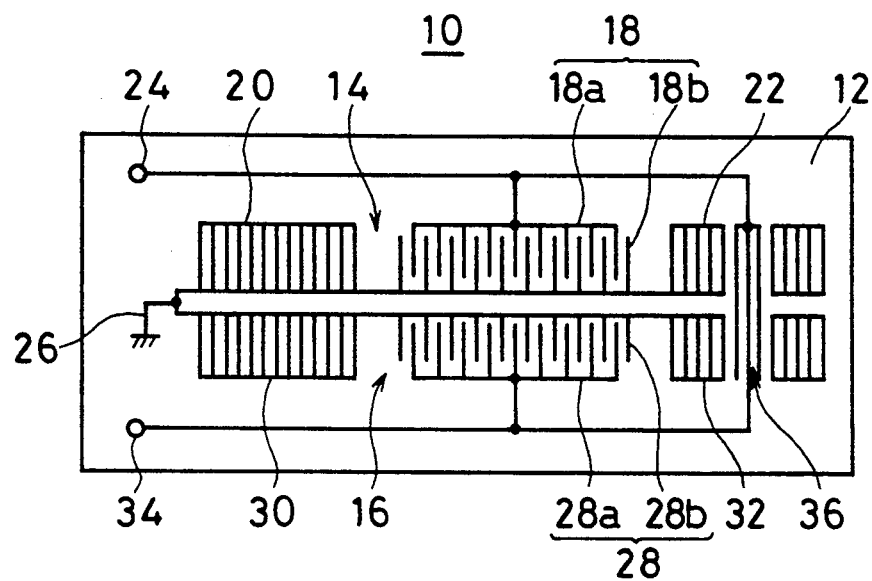
FIG. 10 is an illustration diagram showing still another embodiment of the invention.
Figure 11:
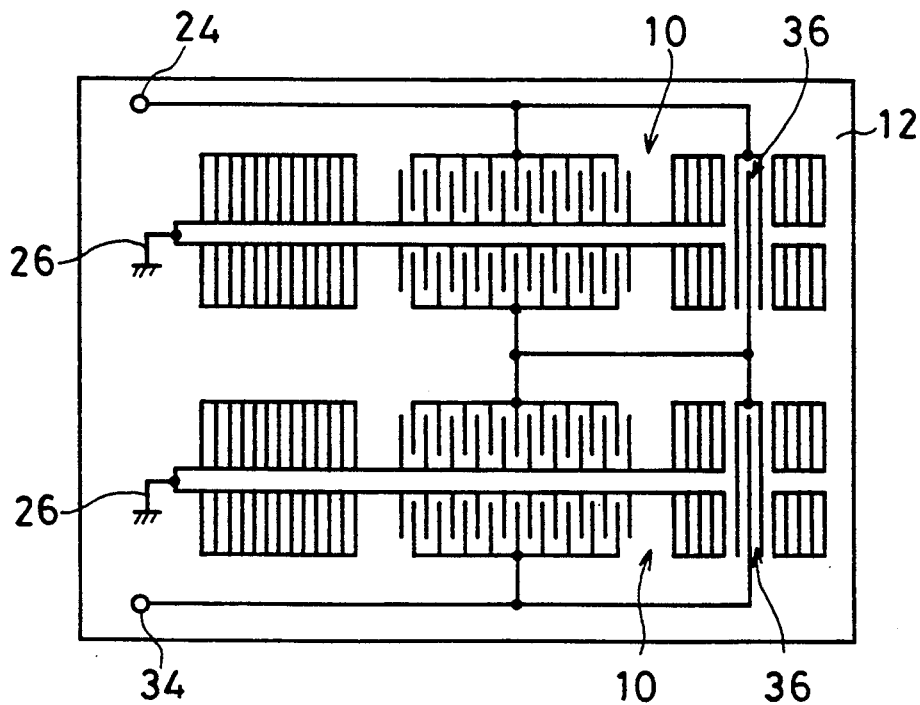
FIG. 11 is an illustration diagram showing two-stage cascade connection of the surface acoustic wave filter of FIG. 10 on the same substrate.
Figure 12:
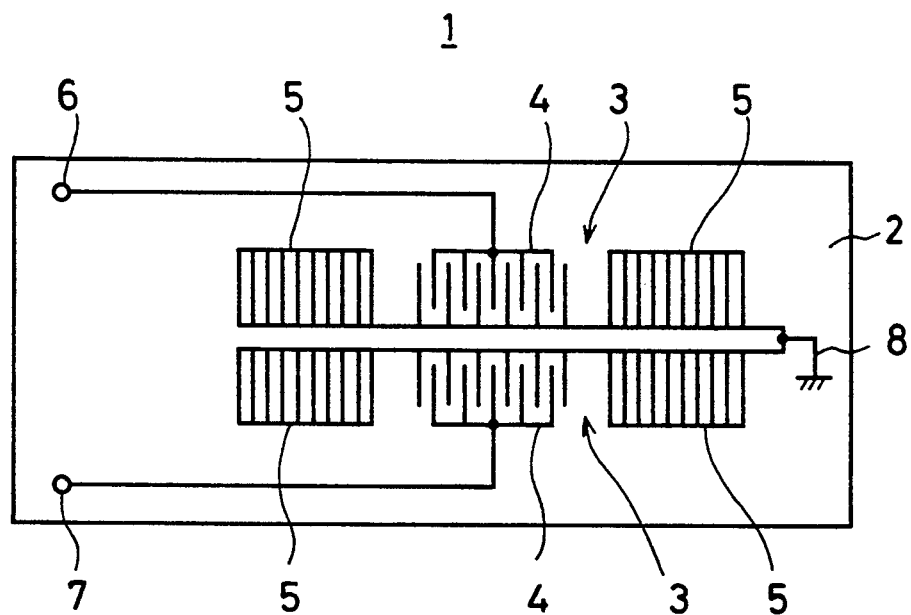
FIG. 12 is an illustration diagram showing one example of the conventional surface acoustic wave filters which are in the background of the invention.
Figure 13:
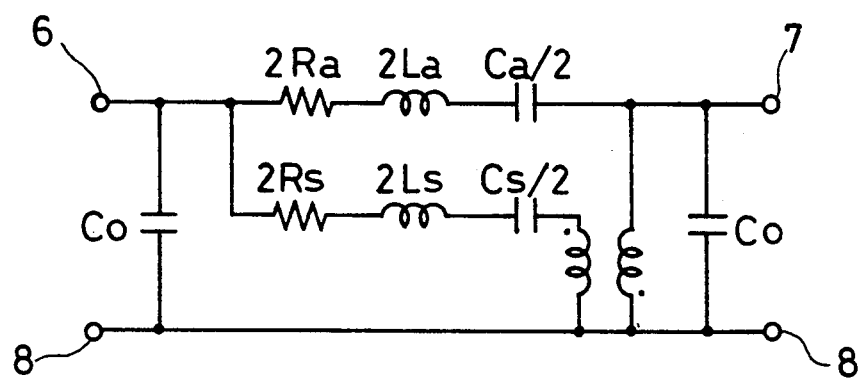
FIG. 13 is an equivalent circuit diagram of the conventional surface acoustic wave filter of FIG. 12.
Figure 14:
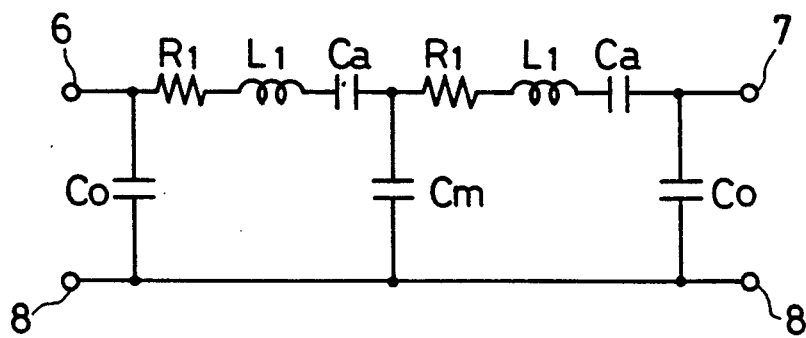
FIG. 14 is an equivalent circuit diagram equal to the equivalent circuit diagram of FIG. 13.

FIG. 11 is an illustration diagram showing two-stage cascade connection of the surface acoustic wave filter 10 of FIG. 10. As shown in FIG. 11, when connecting two surface acoustic wave filters 10, the connection can be simply performed with a short wiring. The surface acoustic wave filter 10 of the present invention can have steep selectivity like the surface acoustic wave filter of FIG. 6, and has no affection of inductance produced by wire bonding and drawing around electrodes, and can be manufactured in small size.

In this surface acoustic wave filter 10, the electrostatic capacity 36 is formed by utilizing the electrode of the reflectors 22 and 32, thus this type of surface acoustic wave filter 10 does not generate the unwanted mode spurious wave like a surface acoustic wave filter in which an electrostatic capacity is formed in the interdigital transducer portions.

In addition, using this surface acoustic wave filter 10, a frequency characteristic having steep selectivity can be obtained even when only one stage of the filter is used or two or more stages of the filter are cascade-connected. In FIGS. 10 and 11, though the electrostatic capacity 36 is formed in almost the centers of the reflectors 22 and 32, the electrostatic capacity 36 may be formed at the end portion of the reflectors 22 and 32. Furthermore, the capacity 36 may be formed in the portions of other reflectors 20 and 30.

It will be apparent from the foregoing that, while the present invention has been described in detail and illustrated, these are only particular illustrations and example and the invention is not limited to these. The spirit and scope of the invention is limited only by the appended claims.

What is claimed is:

1. A surface acoustic wave filter including a piezoelectric substrate having a longitudinal axis;
   two surface acoustic wave resonators on said substrate which comprise respective interdigital transducers, each formed by interdigitating two comb-like electrodes, and two reflectors, each formed by a plurality of electrodes parallel to one another;
   said interdigital transducers and reflectors being disposed symmetrically about said longitudinal axis on said piezoelectric substrate; and
   an electrostatic capacity being bridged between an input terminal and an output terminal of the filter, said electrostatic capacity being formed on said piezoelectric substrate by interdigitating respective capacitive electrodes formed within each of said two interdigital transducers of said two surface acoustic wave resonators.

2. A surface acoustic wave filter according to claim 1, wherein said capacitive electrodes are formed at a middle portion of said interdigital transducers.

3. A surface acoustic wave filter according to claim 1, further comprising leads for connecting respective input and output terminals with said interdigital transducers; said leads being connected from said input and output terminals directly to said interdigital transducers near a middle portion of said interdigital transducers.

4. A surface acoustic wave filter according to claim 3, wherein said capacitive electrodes are formed at said middle portion of said interdigital transducers.

5. A surface acoustic wave filter including a piezoelectric substrate having two ends and a longitudinal axis;
   two surface acoustic wave resonators on said substrate which comprise respective interdigital transducers, each formed by interdigitating two comb-like electrodes, and two reflectors at opposite ends of said substrate on both sides of said interdigital transducers, each formed by a plurality of electrodes parallel to one another;
   said interdigital transducers and reflectors being disposed symmetrically about said longitudinal axis on said piezoelectric substrate; and
   an electrostatic capacity being bridged between an input terminal and an output terminal of the filter, said electrostatic capacity being formed on said piezoelectric substrate by interdigitating respective capacitive electrodes of said interdigital transducers of said two surface acoustic wave resonators;
   wherein a first pitch between said capacitive electrodes is smaller than a second pitch between said comb-like electrodes of said interdigital transducers.

6. A surface acoustic wave filter including a piezoelectric substrate having two ends and a longitudinal axis;

two surface acoustic wave resonators on said substrate which comprise respective interdigital transducers, each formed by alternately interdigitating two comb-like electrodes, and two reflectors, at opposite ends of said substrate on both sides of said interdigital transducers by a plurality of reflector electrodes parallel to one another;

said interdigital transducers and reflectors being disposed symmetrically about said longitudinal axis on said piezoelectric substrate; and an electrostatic capacity being bridged between an input terminal and an output terminal of the filter, said electrostatic capacity being formed on said piezoelectric substrate by interdigitating respective capacitive electrodes of said reflectors.

7. A surface acoustic wave filter according to claim 6, wherein a first pitch between the capacitive electrodes is equal to a second pitch between the reflector electrodes of said reflectors.

8. A surface acoustic wave filter according to claim 6 wherein said capacitive electrodes are formed near a middle portion of said reflectors.

* * * * *